US006764658B2

(12) United States Patent
Denes et al.

(10) Patent No.: US 6,764,658 B2
(45) Date of Patent: Jul. 20, 2004

(54) PLASMA GENERATOR

(75) Inventors: Ferencz S. Denes, Madison, WI (US); Sorin O. Manolache, Madison, WI (US); Noah Hershkowitz, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 236 days.

(21) Appl. No.: 10/041,378

(22) Filed: Jan. 8, 2002

(65) Prior Publication Data

US 2003/0129107 A1 Jul. 10, 2003

(51) Int. Cl.[7] .......................... B01J 19/12; C23C 16/00; H01L 21/306
(52) U.S. Cl. ........................ 422/186.04; 422/186.18; 422/186.19; 422/186.2; 422/186.29; 118/723 MP; 118/723 E; 118/723 ER; 204/298.07; 204/298.33; 156/345.29; 156/345.33; 156/345.34; 156/345.38
(58) Field of Search .................... 422/186.04, 186.18, 422/186.19, 186.2, 186.29; 118/723 MP, 723 E, 723 ER; 204/298.07, 298.33; 156/345.29, 345.33, 345.34, 345.38

(56) References Cited

U.S. PATENT DOCUMENTS

| 5,102,523 A | * | 4/1992 | Beisswenger et al. . 204/298.33 |
| 5,185,132 A | | 2/1993 | Horiike et al. |

(List continued on next page.)

FOREIGN PATENT DOCUMENTS

| EP | 0346055 A2 | 12/1989 |
| EP | 0617142 A1 | 9/1994 |

(List continued on next page.)

OTHER PUBLICATIONS

Lee, Shiuh–Dong, Surface Modification and Grafting of Synthetic and Natural Polymeric Substrates under Continuous Flow Corona Discharge Conditions, Review Paper, Materials Science Program, University of Wisconsin–Madison, Dec. 29, 1995.

(List continued on next page.)

Primary Examiner—Rodney G. McDonald
(74) Attorney, Agent, or Firm—Craig A. Fieschko, Esq.; DeWitt Ross & Stevens S.C.

(57) ABSTRACT

A plasma generator includes several plasma sources distributed in an array for plasma treatment of surfaces. Each plasma source includes first and second conductive electrodes. Each second electrode has a gas passage defined therein, and one of the first electrodes is situated within the gas passage in spaced relation from the second electrode, with each gas passage thereby constituting the free space for plasma generation between each pair of first and second electrodes. An insulating layer is interposed between the first and second electrodes to facilitate plasma formation via dielectric barrier discharge (DBD) in the gas passages between the first and second electrodes. The first electrodes may be provided in a monolithic structure wherein they all protrude from a common bed, and similarly the second electrodes may be monolithically formed by defining the gas passages within a common second electrode member. The first electrode bed may then be situated adjacent the second electrode member with its first electrodes extending into the gas passages. The space between the first electrode bed and the second electrode member defines a plenum space onto which the gas passages open. The plenum space, and thus the gas passages, may then be provided with process gas to generate plasma within the gas passages between the first and second electrodes. Plasma ejected from the gas passages will impinge upon and treat an adjacently-situated workpiece without the need to pass the workpiece through the gas passages, and thus the size of the workpiece to be treated is not limited by the size of the gas passages (i.e., the free space wherein plasma is generated). The ability to utilize monolithically-formed first electrodes and/or second electrodes allows for significantly denser placement of plasma sources in arrays, thereby leading to more complete plasma treatment of surfaces.

50 Claims, 3 Drawing Sheets

U.S. PATENT DOCUMENTS

| | | | |
|---|---|---|---|
| 5,198,724 A | | 3/1993 | Koinuma et al. |
| 5,369,336 A | | 11/1994 | Koinuma et al. |
| 5,403,453 A | | 4/1995 | Roth et al. |
| 5,529,631 A | | 6/1996 | Yoshikawa et al. |
| 5,534,232 A | | 7/1996 | Denes et al. |
| 5,549,780 A | | 8/1996 | Koinuma et al. |
| 5,648,000 A | * | 7/1997 | Yamazaki et al. ............ 216/67 |
| 5,733,610 A | | 3/1998 | Okazaki et al. |
| 5,895,558 A | | 4/1999 | Spence |
| 5,908,539 A | | 6/1999 | Young et al. |
| 5,908,602 A | | 6/1999 | Bárdos et al. |
| 5,972,176 A | | 10/1999 | Kirk et al. |
| 5,996,528 A | * | 12/1999 | Berrian et al. ........... 118/723 E |
| 6,054,018 A | | 4/2000 | Denes et al. |
| 6,082,292 A | | 7/2000 | Denes et al. |
| 6,096,564 A | | 8/2000 | Denes et al. |
| 6,165,314 A | * | 12/2000 | Gardner et al. ........ 156/345.33 |
| 6,194,036 B1 | * | 2/2001 | Babayan et al. ............ 427/563 |
| 6,262,523 B1 | | 7/2001 | Selwyn et al. |

FOREIGN PATENT DOCUMENTS

| | | |
|---|---|---|
| EP | 0603784 B1 | 9/1998 |
| JP | 6330326 | 2/1988 |
| JP | 11003798 | 1/1999 |
| WO | WO 99/20809 | 4/1999 |

OTHER PUBLICATIONS

Manoloche, S., Young, A., and Denes, F., Cyanopolyyne–type Structure Synthesized Under Dense Medium Plasma Conditions, *Hakone VI International Symposium on High Pressure, Low Temperature Plasma Chemistry*, Cork, Ireland, Aug. $31^{st}$–Sep. $2^{nd}$, 133–137 (1998).

Kelly–Witenberg, K., Montie, T.C., Brickman, C., Roth, J.R., Carr, A.K., Sorge, K., Wadsworth, L.C., and Tsai, Ppy, Room temperature sterilization of surfaces and fabrics with a One Atmosphere Uniform Glow Discharge Plasma, *Journal of Industrial Microbiology & Biotechnology*, 20, 69–74 (1998).

Montie, T.C., Kelly–Witenberg, K., and Roth, J.R., An Overview of Research Using the One Atmosphere Uniform Glow Discharge Plasma (OAUGDP) for Sterilization of Surfaces and Materials, *IEEE Transaction on Plasma Science*, 28(1), 41–50 (2000).

Van Brunt, R.J., Physics and Chemistry of Partial Discharge and Corona—Recent Advances and Future Challenges, 1994 Whitehead Memorial Lecture.

Danikas, M.G., "The Definition Used for Partial Discharge Phenomena", *IEEE Trans. Elec. Insul.*, vol. 28, pp. 1075–1081, (1993).

Krueger, F.H., Gulski, E., and Krivda, A., "Classification of Partial Discharges", *IEEE Trans. Elec. Insul.*, vol. 28, pp. 917–931, (1993).

Eliasson, B., Hirth, M., and Kogelschatz, U., Ozone synthesis from oxygen in dielectric barrier discharges, *J. Phys. D: Appl. Phys.*, 20, 1421–1437, (1987).

Eliasson, B., Engli, W., and Kogelschatz, U., Modeling of dielectric barrier discharge chemistry, *Pure & Appl. Chem.*, 66, 1275–1286, (1994).

Gentile, A.C. and Kushner, M.J., Microstreamer dynamics during plasma remediation of NO using atmospheric pressure dielectric barrier discharges, *J.G. Appl. Phys.*, 79, 3877–3885, (1996).

Boeuf, J–P and Pitchford, L.C., Calculated Characteristics of an ac Plasma Display Panel Cell, *IEEE Trans. Plasma Sci.*, 24, 95–96, (1996).

Kogelschatz, U., Eliasson, B., and Egli, W., Dielectric–Barrier Discharges, Principle and Applications, *J. Phys., IV France 7*, C4–47–C4–66. (1997).

Goldman, M., Goldman, A., and Sigmond, R.S., The corona discharge, its properties and specific uses, *Pure & Applied Chem.*, vol. 57, No. 9, pp. 1353–1362, (1985).

Donohoe, K.G. and Wydenven, T., "Plasma Polymerization of Ethylene in an Atmospheric Pressure Discharge", *Plasma Chemistry (ISPC–4)*, Zurich, Aug. 27–Sep. 1, 1979, S. Vrepek and J. Hertz, Eds., pp. 765–771 (1979).

Kanazawa, S., Kogoma, M., Moriwski, T., and Okazaki, S.,Stable glow plasma at atmospheric pressure, *J. Phys. D: Appl. Phys.* 21, 838–840 (1988).

Yokoyama, T., Kogoma, M. Kanazawa, S. Moriwaki, T., and Okazaki, S., The improvement of the atmospheric–pressure glow plasma method and the deposition of organic films, *J. Phys. D: Appl. Phys.* 23, 374–377 (1990).

Okazaki, S., Kogoma, M., Uehare, M., and Kimura, Y., Appearance of stable glow discharge in air, argon, oxygen and nitrogen at atmospheric pressure using a 50 Hz source, *J. Phys. D: Appl. Phys.* 26, 889–892 (1993).

Kogoma, M., and Osazaki, S., Raising of ozone formation efficiency in a homogeneous glow discharge plasma at atmospheric pressure, *J. Phys. D: Appl. Phys.* 27, 1985–1987 (1994).

Babukutty, Y., Prat, R., Endo, K., Kogoma, Okazaki, S., And Kodama, M., Poly(vinyl chloride) Surface Modification Using Tetrafluoroethylene in Atmospheric Pressure Glow Discharge, *Langmuir*, 15, 7055–7062 (1999).

Prat, R., Koh, Y.J., Babukutty, Y., Kogoma, M., Okazaki, S., and Kodama, M., Polymer deposition using atmospheric pressure plasma glow (APG) discharge, *Polymer*, 41, 7355–7360 (2000).

Falkenstein, Z. and Coogan, J.J., Photoresist etching with dielectric barrier discharges in oxygen, *J. Appl. Phys.*, 82(12), 6273–6280 (1997).

Babayan, S.E., Jeong, J.Y., Tu, V.J., Park, J., Selwyn, G.S., and Hicks, R.F. (1998) *Plasma Sources Sci. Technol.*, 7, 286.

Eliasson, B. and Kogelschatz, U., (1991), *IEEE Trans. Plasma Sci.*, 19, 309.

Ha, H. Yoshimoto, M., Koinuma, H., Moon, B. and Ishiwara, H., (1996) *Appl. Phys. Lett. 68*, 2965.

Inomata, K., Ha, H., Chaudhary, K. and Koinuma, H., (1994) *Appl. Phys. Lett.* 64, 46.

Salge, J.,(1996) Plasma–assisted deposition at atmospheric pressure, *Surf. Coat. Tech.*,80, 1.

Schütz, A., Jeong, J.Y., Babayan, S.E., Park, J., Selwy, G.S., and Hicks. R.F. (1998) *IEEE Trans. Plasma Sci.*, 26, 1685.

Thyen, R., Weber, A., and Klages, C.P., (1997) Plasma–enhanced chemical–vapour–deposition of thin films by corona discharge at atmospheric pressure, *Surf. Coat. Tech.*, 97, 426.

* cited by examiner

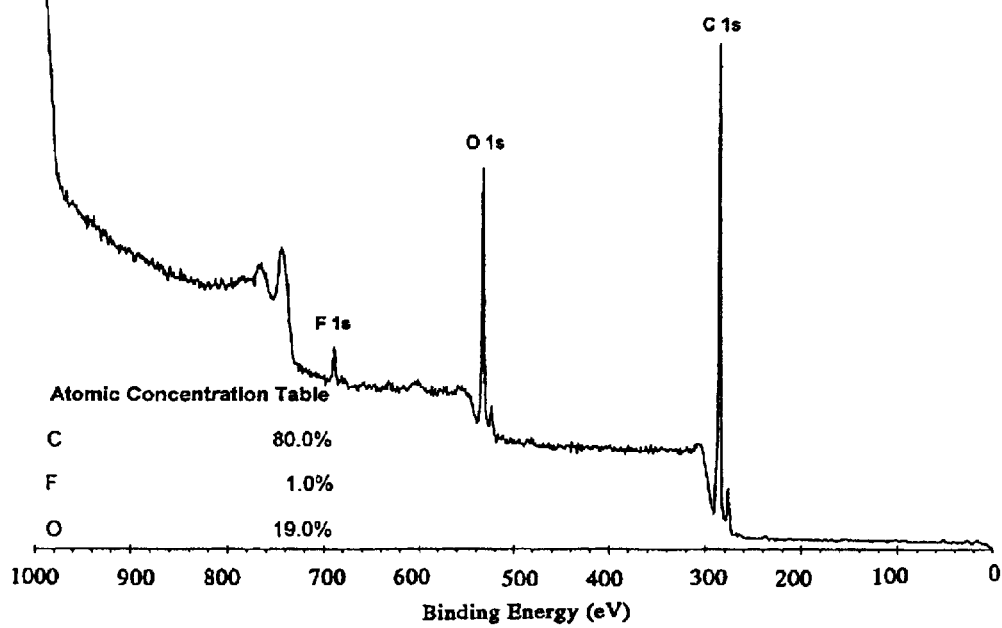
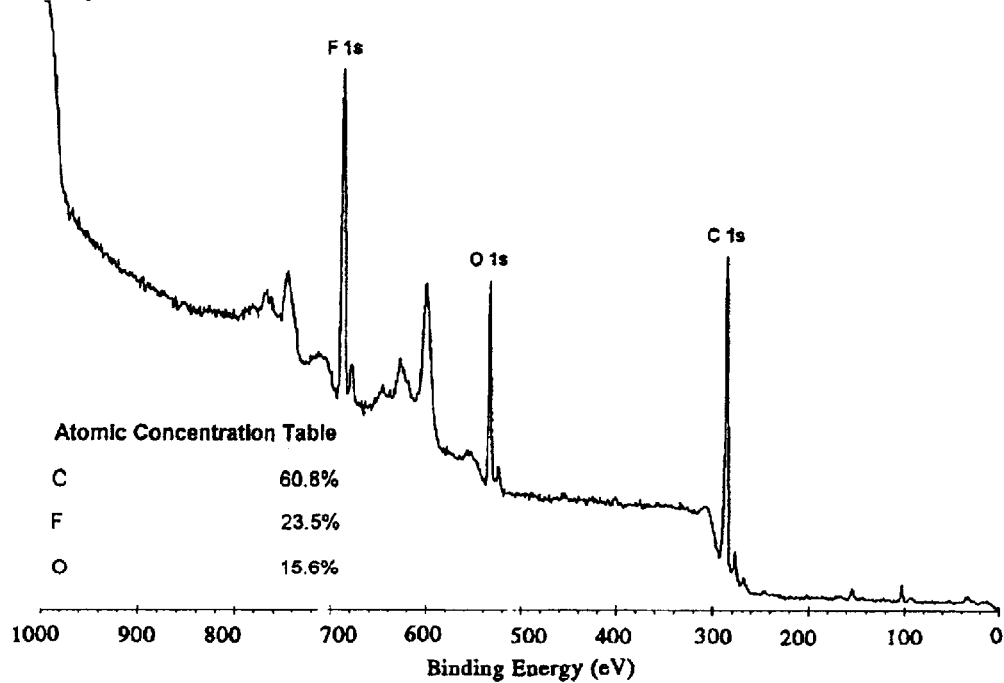

PLASMA GENERATOR

STATEMENT REGARDING FEDERALLY SPONSORED RESEARCH

This invention was made with United States government support awarded by the following agencies:

Navy Grant No(s).: N00014-00-0861

The United States has certain rights in this invention.

FIELD OF THE INVENTION

This disclosure concerns an invention relating generally to plasma generators, and more specifically to "cold" plasma generators and/or plasma generators operating at atmospheric pressure.

BACKGROUND OF THE INVENTION

Plasma, the fourth state of matter, consists of gaseous complexes in which all or a portion of the atoms or molecules are dissociated into free electrons, ions, free radicals, and neutral particles. On earth, plasma occurs naturally in lightning bolts, flames, and similar phenomena, or may be manufactured by heating a gas to high temperatures, or by applying a strong electric field to a gas, the more common method. The latter type of plasma, often referred to as an electrical discharge plasma, can be further sub-classified as a "hot" plasma, i.e., dissociated gas in thermal equilibrium at high temperatures (~5000K), or "cold" plasma, i.e., non-thermal plasma wherein the dissociated gas is at low temperatures but its electrons are at high temperature (i.e., in a state of high kinetic energy).

The usefulness of plasma for manufacturing and other applications is best understood by reviewing common applications for cold plasma. As an example, common cold plasma processing methods are commonly used to alter the surface properties of industrial materials without affecting the bulk properties of the treated material. The most common cold plasma surface treatments may be generally categorized as cleaning, activation, grafting, and deposition processes, each of which will now be briefly reviewed.

Plasma cleaning processes typically utilize inert or oxygen plasmas (i.e., plasmas generated from inert or oxygen-based process gases) to remove contaminants (generally organic contaminants) on a material surface subjected to vacuum. The contaminants are exposed to a plasma stream, and they undergo repetitive chain scission from the plasma until their molecular weight is sufficiently low to boil away in the vacuum.

Plasma activation is used when a material (generally a polymer or elastomer) is subjected to a plasma generally produced from an inert or non-carbon gas, and results in the incorporation of different moieties of the process gas onto the surface of the material being treated. For example, the surface of polyethylene normally consists solely of carbon and hydrogen. However, if subjected to an appropriate plasma, the surface may be activated to contain a variety of functional groups which enhance the adhesion and permanence of coatings later applied to the surface. As an example, a surface can be treated to greatly enhance its ability to bond with adhesives.

Deposition, which is exemplified by a process referred to as plasma-enhanced chemical vapor deposition (PECVD), utilizes a complex molecule as the process gas. The process gas molecules are decomposed near the surface to be treated, and recombine to form a material which precipitates onto and coats the surface.

Grafting generally utilizes an inert process gas to create free radicals on the material surface, and subsequent exposure of the radicalized surface to monomers or other molecules will graft these molecules to the surface.

The foregoing cold plasma processes have numerous practical applications, including sterilizing of medical equipment, application of industrial and commercial coatings, etching computer chips, semiconductors, and circuits, and so forth. Hot plasma might be used for generally the same types of applications as cold plasma. However, hot plasma applications are limited since most organic matter cannot be treated under the high temperatures required for hot plasmas without severe degradation. Additionally, hot plasma technology is energy and equipment intensive, making it expensive and difficult to work with. In contrast, cold plasma may be used at temperature ranges as low as room temperature (or lower), making it significantly easier to handle. However, cold plasma processes have the disadvantage that they generally need low pressure conditions to operate (generally a vacuum), and consequently need large, static (i.e., immobile) equipment with a low-pressure treatment chamber to operate. This causes significant manufacturing constraints since the need to treat items within an enclosed chamber makes it inherently difficult to process the items continuously in assembly-line fashion, as opposed to processing the items in batches.

Some of these difficulties have been overcome with further developments in dielectric barrier discharge (DBD) plasma production processes. These processes, which may take place at room temperature and non-vacuum conditions, space a pair of electrodes apart across a free space, with one or more dielectric layers also being situated between the electrode. When an alternating high voltage electrical current is applied to the plates, "microbursts" of plasma are generated from the gas(es) in the free space. DBD apparata are sometimes used to generate ozone by ionizing oxygen passing through the free space of the apparatus, or to break apart volatile gaseous organic compounds passing through the free space. However, conventional DBD plasma generation apparata are not well suited for surface treatment of workpieces because of the difficulty in transporting the workpieces through the free space without the plasma's interference with the transport mechanism; for example, one generally cannot run a conveyor through the free space. Plasma processes using DBD are further limited by the size constraints that the free space imposes on the workpieces. Since the free space is relatively small, the size range of workpieces that can be treated is correspondingly small, which greatly limits usage.

Thus, it would be useful to have available methods and apparata of generating cold plasma at low pressures (including at and/or around atmospheric pressure) while alleviating or eliminating the disadvantages of prior cold plasma equipment and methods.

SUMMARY OF THE INVENTION

The invention involves a plasma generator which is intended to at least partially solve the aforementioned problems. To give the reader a basic understanding of some of the advantageous features of the invention, following is a brief summary of preferred versions of the plasma generator. As this is merely a summary, it should be understood that more details regarding the preferred versions may be found in the Detailed Description set forth elsewhere in this document. The claims set forth at the end of this document then define the various versions of the invention in which exclusive rights are secured.

The plasma generator includes several plasma sources distributed in an array for plasma treatment of surfaces. Each plasma source includes spaced first and second conductive electrodes between which plasma will be generated. Each second electrode has a gas passage defined therein, and one of the first electrodes is situated within the gas passage in spaced relation from the second electrode, with the gas passage thereby constituting the free space for plasma generation. As an example, each second electrode may be formed as a hollow cylinder having an interior gas passage, and each first electrode may be formed as a rod which is concentrically situated within a second electrode's gas passage spaced from the gas passage walls. An insulating layer is interposed between the first and second electrodes, as by providing a ceramic coating on the surfaces of the first electrodes and/or upon the gas passage walls of the second electrodes, to facilitate plasma formation via dielectric barrier discharge (DBD) in the gas passages between the first and second electrodes.

The first electrodes may be provided on a common bed so that they protrude therefrom, with their bases affixed to the common bed and their tips being spaced from the common bed. This monolithic or integrally affixed first electrode structure, wherein the common bed may take the form of a plate having the first electrodes extending therefrom as groups of adjacently-spaced protrusions, therefore effectively connects the first electrodes together in a parallel electrical relationship. Similarly, the second electrodes may be formed by defining the gas passages within a common second electrode member, with the gas passages extending from a common inlet surface on the second electrode member to a common outlet surface on the common second electrode member. For example, the second electrode member may be formed as a plate having a series of gas passages formed as holes extending through the plate.

The first electrode bed may then be situated adjacent the inlet surface of the second electrode member, with its first electrodes situated within the gas passages so that the tips of the first electrodes extend towards the outlet surface of the second electrode member. The space between the bed of the first electrodes and the inlet surface of the second electrode member defines a gas plenum space onto which the gas passages open. Thus, supplying process gas(es) to the plenum space will in turn provide the process gas to the gas passages to travel between the first and second electrodes for plasma generation.

Apart from providing an insulating layer between the first and second electrodes, an insulating layer may also be provided on or adjacent to the inlet surface of the second electrode member, and/or the common bed of the first electrodes, to prevent arcing between the second electrode member and the first electrode bed. Insulation of the first and second electrodes is preferably done by casting ceramic material on or about the portions of the electrodes and/or surrounding structure which are desirably insulated. If desired, silicone or other expandable/compressible coatings may be applied prior to application of the ceramic material so that if the underlying structure undergoes thermal expansion or contraction, the expandable/compressible coating will prevent transmission of stresses to the ceramic insulation.

A gas supply may then be used to communicate process gas to the gas passages of the second electrodes, as by connecting a gas supply to the plenum space. Plasma generated in process gas situated in the gas passages between the first and second electrodes is ejected from the gas passages onto a workpiece situated adjacent the outlet surfaces of the second electrodes. A gas distributor for equalizing or otherwise tailoring the gas supply to the gas passages can be situated between the gas supply and the gas passages so that the desired amount of process gas will be supplied to each plasma source (i.e., to each pair of first and second electrodes). This can be done, for example, by situating a porous barrier in the plenum space between the gas supply and the gas passages so that each gas passage has approximately the same inlet pressure, and thus receives approximately the same amount of process gas.

The foregoing arrangement allows a workpiece to be situated adjacent to the outlet surfaces of the second electrodes so that plasma generated in the gas passages will impinge on the workpiece surface. Since the workpiece does not travel through the free space wherein the plasma is generated (i.e., the gas passages), the size of the workpiece is not limited by the size of the free space. Additionally, conveyors or other positioning means for adjusting the location of a workpiece with respect to the plasma sources may be accommodated since the workpiece and its positioning means need not be situated in the gas passages. The positioning means may allow transport of successive workpieces past the plasma sources for plasma treatment in assembly-line fashion, and/or may allow the plasma generator to be repeatedly translated over the same or different areas of a workpiece surface for more complete treatment. Unlike some prior plasma generators, the present plasma generator may be constructed in a sufficiently lightweight and compact unit that it can be readily moved over workpieces or from area to area, and can even be made in a handheld unit.

The plasma sources are preferably situated on the plasma generator in such a manner that when a workpiece is translated with respect to the plasma generator, each unit area of the workpiece travels adjacent to at least one plasma source for treatment. Stated differently, it is preferred that the plasma sources be arrayed in such a manner that "lanes" of untreated workpiece surface do not result when the surface travels adjacent to the plasma generator.

Where the outlet surfaces of the second electrodes are arrayed along a surface (e.g., along the outlet surface of the second electrode member), they are preferably surrounded by a ledge so that when the ledge is situated adjacent a workpiece to be treated, the ledge defines an at least substantially enclosed chamber between the outlet surfaces and the workpiece, with the chamber being bounded by the outlet surface, the ledge, and the workpiece. This enclosed chamber contains the exhaust produced by the plasma treatment process, and exhaust outlets situated on or about the ledge can be provided to remove the exhaust from the chamber at the same time plasma is injected therein. Since exhaust to the surroundings may be eliminated or greatly reduced, this allows use of the plasma generator without significant ventilation equipment, e.g., one need not enclose and vent an entire conveyor line of workpieces that are being subjected to plasma treatment.

Advantageously, the structure of the plasma generator also allows it to be readily adapted to accommodate heating and/or cooling components, so that the process gas being used for plasma generation can be heated or cooled prior to or during plasma generation to obtain desired effects. As an example, enclosed fluid passages for carrying heat-exchanging fluids may be formed within one or more of the second electrode member (and/or its electrodes), the common bed (or its first electrodes), any insulating layers formed on or between the foregoing components, and/or on any framework associated with the foregoing components. The ability to provide heating and/or cooling components directly within the electrodes and/or their associated structure saves space and better provides for the ability to densely array the plasma sources, leading to more complete surface treatment of workpieces.

Test results have demonstrated that plasma generators using at least some of the foregoing features allow highly efficient plasma treatment of even very large workpiece surfaces, including surfaces of conveyorized workpieces. Additionally, the plasma generator is believed to provide a substantially uniform plasma emission over a greater surface area than known prior plasma generators, possibly owing to the density at which the plasma sources may be situated, and/or the high efficiency of the concentric electrode arrangement used in the preferred versions of the invention described in this document. Further advantages, features, and objects of the invention will be apparent from the following detailed description of the invention in conjunction with the associated drawings.

BRIEF DESCRIPTION OF THE DRAWINGS

FIG. 5 is a x-ray photoelectron spectrogram of a polyethylene film subjected to surface oxidation using a plasma generator in accordance with the present invention.

FIG. 6 is a x-ray photoelectron spectrogram of a polyethylene film subjected to surface fluorination using a plasma generator in accordance with the present invention.

DETAILED DESCRIPTION OF PREFERRED EMBODIMENTS OF THE INVENTION

Figure 1:
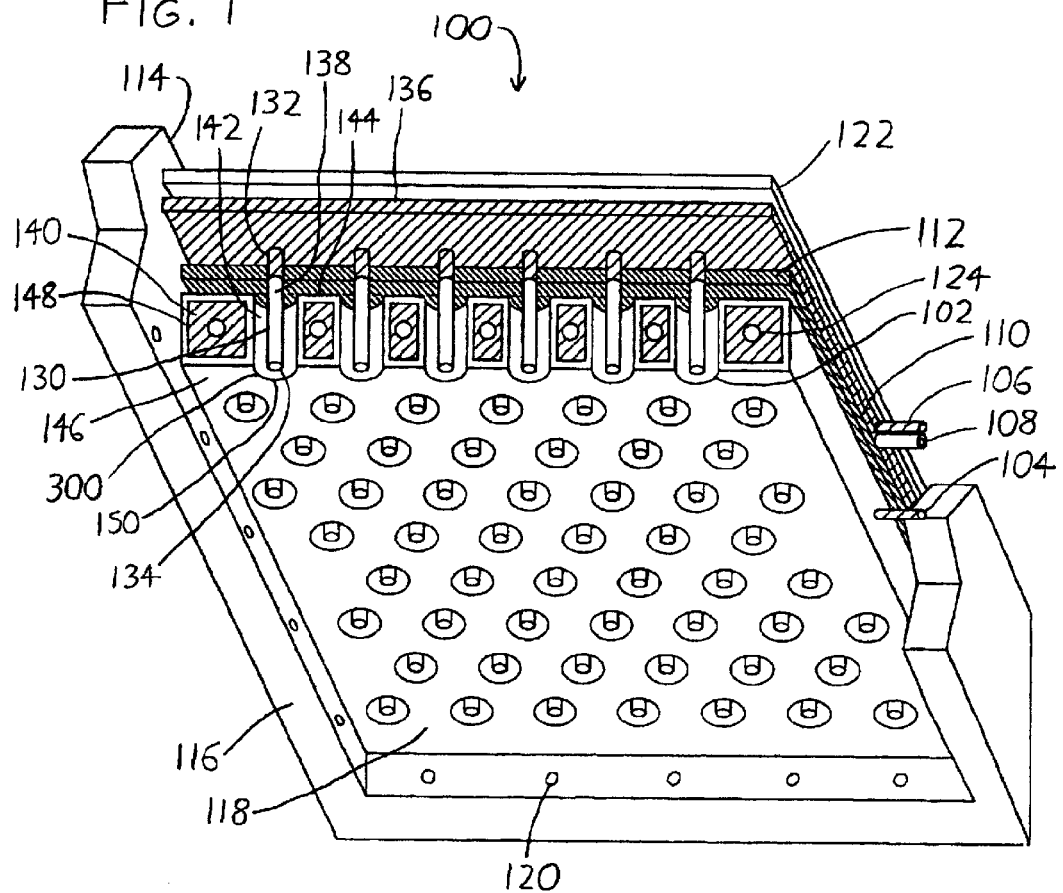
FIG. 1 is a bottom perspective view of an exemplary plasma generator 100 in accordance with the invention, with the generator frame 114 shown broken away along selected sides of the plasma generator 100, and with the second electrode member 140 and plate-like gas distributor 112 shown cut away in a vertical plane parallel to the plane of the drawing and situated along a first row of first electrodes 130 in the plasma generator 100 (this first row of first electrodes 130 not being shown in section).

Referring to FIG. 1, an exemplary plasma generator 100 is shown. The plasma generator 100 includes a number of plasma-emitting plasma sources 102 arrayed in rows, with a first row of plasma sources 102 being more clearly visible owing to the partial removal of element 114 and the sectioning of elements 112 and 140 (these elements being discussed in greater detail later). One of the plasma sources 102, denoted by the reference numeral 300 in FIG. 1, is selected for depiction in greater detail in the sectional view of FIG. 3. It should be understood that the depiction of the representative plasma source 300 in FIG. 3 could equally well depict most of the other plasma sources 102 shown in FIG. 1.

Figure 3:
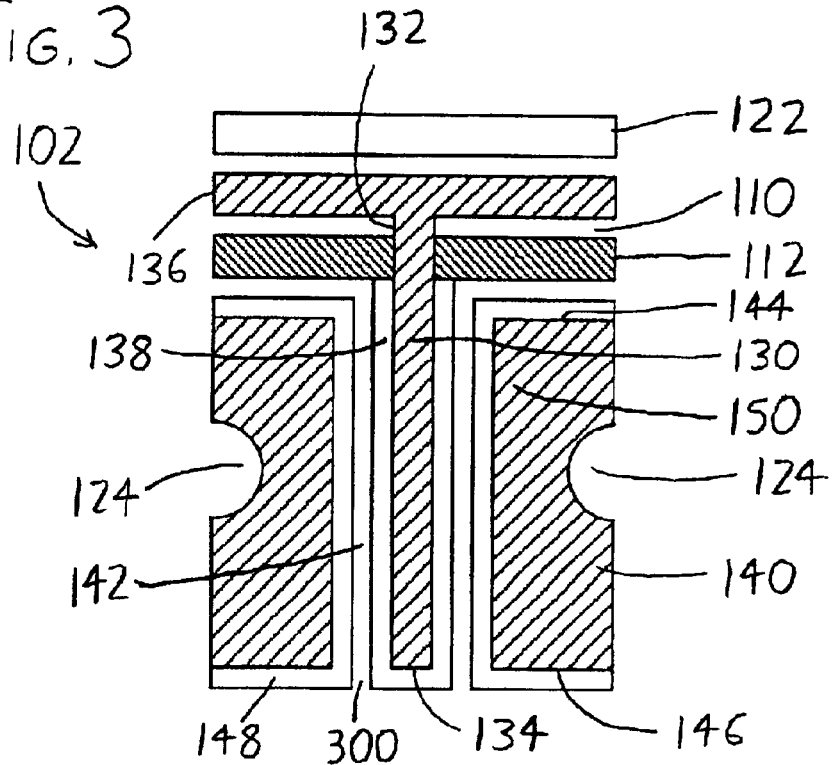
FIG. 3 is a sectional side elevational view of one of the plasma sources 102 of the plasma generator 100 of FIG. 1, this plasma source being depicted at 300 in FIG. 1, illustrating its first electrode 130 and its second electrode 150.

Looking to FIGS. 1 and 3, each plasma source 102 includes an elongated rodlike first electrode 130 having a length extending from a base 132 to a tip 134. The bases 132 of the first electrodes 130 are integrally connected to a plate-like common bed 136. The first electrodes 130 are depicted with an insulating layer 138 extending from their tips 134 along their lengths, with this insulating layer 138 to be discussed in greater detail later.

A second electrode member 140 is provided with several gas passages 142 defined therein, with each gas passage 142 extending between an inlet surface 144 of the second electrode member 140 and an opposing outlet surface 146 (so named because it is this surface 146 from which plasma will be emitted for treatment of workpieces situated adjacent the outlet surface 146). As best seen with reference to FIG. 3, the first electrode bed 136 is situated adjacent to and spaced from the outlet surface 146 of the second electrode member 140, with its first electrodes 130 extending within the gas passages 142, and with the first electrode bases 132 situated closer to the second electrode inlet surface 144 and the first electrode tips 134 situated closer to the second electrode outlet surface 146. The surfaces of the first electrodes 130 between their bases 132 and tips 134 are spaced from the walls of the gas passages 142 within the second electrode member 140. Referring back to FIG. 1, it is thus seen that the first electrodes 130 and their common bed 136 are configured in the form of a "bed of nails" wherein the multiple first electrodes 130 extend from the plate-like second electrode member 140 in parallel spaced relation, and the second electrode member 140 is simply configured as a foraminated plate wherein the first electrodes 130 are complementarily fit in spaced relation.

As best seen in FIG. 3, the second electrode member 140 may have an insulating layer 148 provided on the walls of its gas passages 142 (and/or elsewhere) to promote plasma generation via dielectric barrier discharge when the first electrode bed 132 (and its first electrodes 130) are appropriately charged with respect to the second electrode member 140. This insulating layer 148 also helps to prevent arcing between the second electrode member 140 and the first electrodes 130, any workpiece(s) being plasma-treated, and/or other components. The insulating layer 148 may be formed on the second electrode member 140 by (for example) molding castable insulating material such as ceramic grout about the second electrode member 140 and its gas passages 142, its inlet surface 144, and/or its outlet surface 146. The casted insulating material may then be allowed to dry, and may be finished for cleanness and uniformity. Since the insulating layer 148 is generally brittle if formed from castable material in the foregoing manner, it may be desirable to first coat the surfaces of the second electrode member 140 with silicone or some other expandable/compressible material so that when the insulating layer 148 is then provided thereon, thermal expansion or contraction in the second electrode member 140 will not cause cracking of the insulating layer 148. The same approach may be used to form the insulating layers 138 on the first electrodes 130 and/or their first electrode bed 136 (if such insulating layers 138 are included), with the first electrodes 130 being insulated for generally the same purposes as the second electrode member 140.

Looking to the right-hand side of FIG. 1, a first electrode power supply lead 104 is connected to the first electrode bed 132, and thus to its first electrodes 130. A second electrode power supply lead 106 is also connected to the second electrode member 140, with the second electrode lead 106 extending through the insulating layer 148 to conductively connect with the second electrode member 140. Referring again to FIG. 3, it should thus be understood that when the first electrode common bed 136 (and the first electrodes 130 thereon) and the second electrode member 140 are appropriately charged, the portions of the second electrode member 140 bounding each of the gas passages 142 will serve as second electrodes 150 within each plasma source 102. Plasma is then generated in process gas traveling within the gas passages 142. Thus, the electrode leads 104 and 106 may be connected to any appropriate power supply (not depicted in the drawings) to enable plasma generation at the plasma sources 102, with the choice of power supply being dictated by factors such as the process gas being used, workpiece characteristics, plasma source-to-workpiece spacing, and the degree of surface treatment desired. In general, the power supply should be capable of providing radio frequency (e.g. 60 hertz to microwave) AC current to achieve plasma generation via dielectric barrier discharge in the plasma generator 100, though other frequencies may be useful in plasma generators having a configuration different from the one depicted in FIGS. 1 and 3.

The process gas may be supplied by a gas supply connected to the gas passages 142. Such a gas supply is not shown in the Figures, though a gas supply conduit 108 suitable for connection to one or more gas, vapor, and or liquid sources is depicted at the right-hand side of FIG. 1. Looking again to FIG. 3, it is seen that the gas passages 142 extend from the outlet surface 146 of the second electrode member 140 to its inlet surface 144, at which point they open onto a plenum space 110 defined between the first electrode bed 136 and the second electrode inlet surface 144. The gas supply conduit 108 supplies process gas to the plenum space 110 so that the gas will flow between the second electrode inlet surface 144 and the first electrode bed 136, into the gas passages 142 between the first electrode 130 and second electrode 150, and from the outlet surface 146 of each of the plasma sources 102.

To better ensure that substantially equal amounts of process gas are supplied to each of the plasma sources 102, the plasma generator 100 preferably includes a gas distributor for supplying each of the gas passages 142 with a desired amount of process gas. The version of the plasma generator 100 depicted in FIGS. 1 and 3 utilizes a porous barrier 112, best seen in FIG. 3, which is situated within the plenum space 110 between the gas supply conduit 108 and each of the gas passages 142. The porous barrier 112, which may be formed of any appropriate porous material (such as a porous ceramic plate), provides a pressure drop between the gas supply conduit 108 and each of the gas passages 142 so that each of the gas passages 142 has substantially equal gas supply pressure (and thus substantially equal process gas flow). Close observation of FIG. 1 illustrates that the gas supply conduit 108 enters under the plenum space 110 atop the porous barrier 112, with the porous barrier 112 being situated between the gas supply conduit 108 and the second electrode member 140 so that process gas must pass through the porous barrier 112 prior to accessing the second electrode inlet surface 144 (and thus prior to entering the gas passages 142 defined therein). Thus, the plasma sources 102 situated closer to the gas supply conduit 108 in FIG. 1 do not experience significantly higher gas flow than plasma sources 102 distant from the gas supply conduit 108. Additionally, where multiple different process gases are introduced via the gas supply conduit 108 without premixing, the porous barrier 112 may help to retain the gases for a sufficient time that more complete mixing is promoted prior to their reaching the second electrode inlet surface 144. However, it should be understood that use of a porous barrier 112 or other gas distributor may not be necessary or useful in the invention, depending on the nature of the gas supply to each of the gas passages 142.

Figure 2:
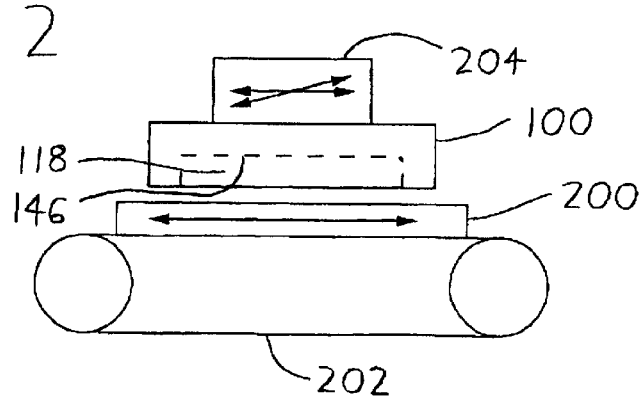
FIG. 2 is a schematic side elevational view of an exemplary plasma treatment arrangement using the plasma generator 100 of FIG. 1, with the plasma generator 100 shown positioned over a workpiece 200, and with the workpiece 200 moving on a conveyor 202 and the plasma generator 100 being moved over the workpiece 200 by a two degree of freedom actuator 204.

Referring again to FIG. 1, it is seen that the first electrode bed 136, second electrode member 140, porous barrier 112, and associated structure mentioned above is enclosed within a frame 114 (shown partially broken away in FIG. 1). The frame 114, which is nonconductive, serves to hold the various components in place with respect to each other. The frame 114 includes a top insulating plate 122 for safety reasons and to prevent shorting of the first electrode base 132 at its top side. The frame 114 also provides a ledge 116 which surrounds the second electrode outlet surface 146 whereupon the plasma sources 102 are located. This ledge 116 extends from the outlet surface 146 in such a manner that when the ledge 116 is situated on or adjacent to a workpiece to be subjected to plasma treatment, a chamber 118 is defined between the outlet surface 146, ledge 116, and workpiece. This arrangement is depicted in FIG. 2, wherein a side view of plasma generator 100 is provided. The frame 114 of the plasma generator 100 is positioned above a workpiece 200, and phantom lines depict the chamber 118 defined within the frame 114. The benefit of providing the chamber 118 is that when the ledge 116 is situated closely adjacent to the workpiece 200, and the plasma generator 100 is activated so that the plasma sources 102 eject plasma towards the surface of the workpiece 200, byproducts of the treatment process—e.g., unused radicals, unadhered ions, and the like—are maintained within the chamber 118 rather than escaping to the ambient environment. Thus, exhaust ducts 120 provided on the ledge 116 (as depicted in FIG. 1) or elsewhere may draw away the process byproducts for disposal or other purposes, and may eliminate the need for an exhaust-capturing enclosure around the area of the plasma generator 100.

To enhance the utility of the plasma generator 100 during plasma treatment operations, it is useful to provide the plasma generator 100 with positioning means for adjusting the location of a workpiece with respect to the plasma sources 102 of the plasma generator 100. The positioning means may take a variety of forms, such as some type of apparatus for repositioning the workpiece with respect to the plasma generator 100. This is exemplified by the conveyor 202 of FIG. 2, which may transport the workpiece 200 adjacent the plasma sources 102 of the plasma generator 100 to treat the surface of the workpiece 200, and which allows multiple workpieces 200 to be treated by the plasma generator 100 by passing them in succession on the conveyor 202 adjacent the plasma generator 100. Alternatively or additionally, the positioning means may take the form of some type of apparatus for repositioning the plasma generator 100 with respect to the workpiece 200, with an example being provided in FIG. 2 by a two-degree-of-freedom actuator 204 which moves the plasma generator 100 in two degrees of freedom with respect to the workpiece 200 (in this case, in a horizontal plane parallel to the surface of the workpiece 200). Exemplary positioning means which may act upon and reposition the workpiece 200 include conveyors, carousels, chutes/slides, pushers, carts, or other structures which are commonly used to impart motion to workpieces. Exemplary positioning means which may act upon and reposition the plasma generator 100 include reciprocating or oscillating linkages, slides, pneumatic or hydraulic actuators, or other structures which are commonly used to reposition tools with respect to workpieces.

FIGS. 1 and 3 also depict heating/cooling passages 124 in the second electrode member 140 for carrying heat transfer fluids through the plasma generator 100, thereby allowing cooling of the plasma generator 100 if necessary or desirable. Alternatively, the heating/cooling passages 124 may allow heating of the plasma generator 100 so that process gas components traveling through the plenum space 110 and/or gas passages 142 can be volatilized for desired plasma generation effects. To illustrate, plasma generation using a process gas which contains organic compounds may yield desirable effects if the process gas is first heated to a volatilized state. The heating/cooling passages 124 are enclosed within the second electrode member 140, i.e., they do not have any permanent openings onto the second electrode inlet or outlet surfaces 144 or 146, so that heating/cooling fluid may flow therein without leakage. The heating/cooling fluid supply associated with the heating/cooling passages 124 is not shown. Rather than providing the heating/cooling passages 124 within the second electrode member 140, they could alternatively or additionally be provided in one or more of the first electrode bed 136, its first electrodes 130, any insulating layers 138 and 148 formed on or between the foregoing components, and/or on any frame 114 associated with the foregoing components. If the heating/cooling fluid is conductive—for example, if water is used for heating/cooling rather than air—it may be desirable to avoid providing the heating/cooling passages 124 in the electrodes and instead placing them in the insulating layers 138 and 148 and/or the frame 114. The ability to provide heating and/or cooling components directly within the electrodes and/or their associated structure saves space and better provides for the ability to densely array the plasma sources 102, leading to more complete surface treatment of workpieces.

Figure 4:
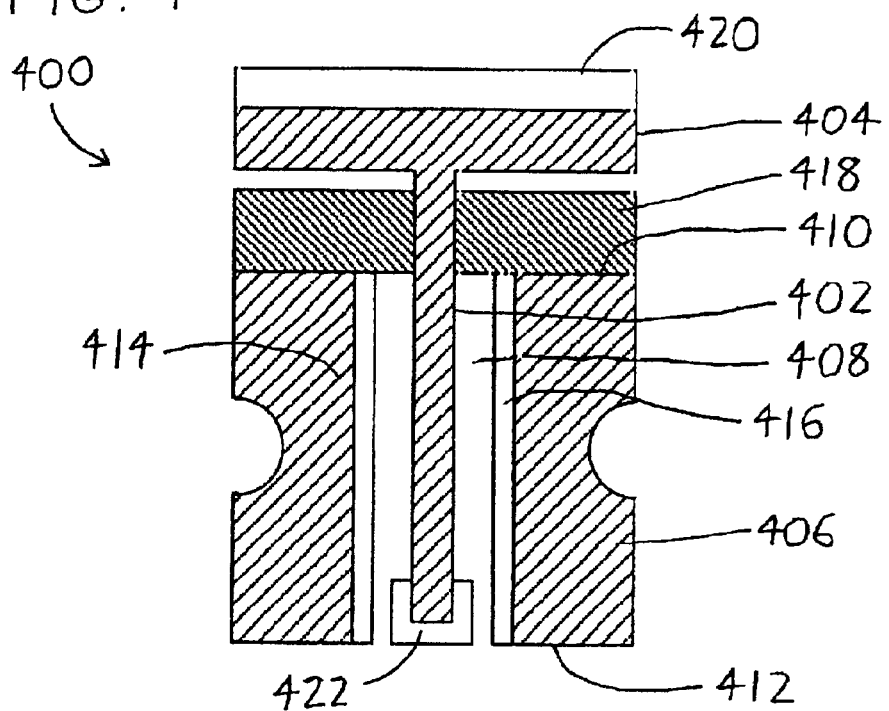
FIG. 4 is a sectional side elevational view of a section of an exemplary alternative plasma source 400 that may be used in place of the plasma source 102 of FIG. 3.

While the insulating layer 148 is depicted in FIG. 3 as being provided on the second electrodes 150 and their common member 140 (with an insulating layer 138 also being provided on the first electrodes 130), it is additionally or alternatively possible to provide an insulating layer upon the first electrode bed 136, or to otherwise situate an insulating layer between the first electrodes 130 (and their common bed 136) and second electrodes 150 (and their common member 140) without directly abutting either one. The importance of the insulating layer(s) is that it facilitates plasma generation via dielectric barrier discharge while allowing process gas to flow between the first and second electrodes 130 and 150, and while preventing shorting between the first and second electrodes 130 and 150 and their associated structures. To illustrate a possible different arrangement, an alternative plasma source 400 is illustrated in FIG. 4, with this plasma source 400 being suitable for use in the plasma generator 100 in place of plasma source 102. The plasma source 400 includes a first electrode 402 extending from a first electrode bed 404 and a second electrode member 406 having a gas passage 408 defined therein between an inlet surface 410 and an outlet surface 412, with the gas passage walls thereby defining a second electrode 414. An insulating layer 416 is provided on the walls of the gas passage 408, but it does not extend to the second electrode inlet surface 410 or second electrode outlet surface 412. Rather, the second electrode inlet surface 410 is insulated by a porous barrier 418 which also serves as a gas distributor to regulate gas pressure within the gas passage 408. The second electrode outlet surface 412 is illustrated as being uninsulated, though it may be partially or wholly insulated if desired, e.g., to prevent arcing between the outlet surface and the workpiece. A top insulating plate 420 is also depicted upon the first electrode bed 404. The tip of the first electrode 402 is provided with an insulating layer 422 in the event that the workpiece to be treated with plasma is conductive, in which case discharge may occur between the tip of the first electrode 402 and the workpiece if such insulation is not provided. The insulating layer 422 on the tip of the first electrode 402 also helps to prevent or hinder arcing between the first electrode 402 and the outlet surface 412 of the second electrode 414. However, it should be understood that depending on factors such as the degree of conductivity of the workpiece, the type and degree of charge applied to the first electrode 402, the spacing between the tip of the first electrode 402 and the workpiece, and the like, it may not be necessary to provide the insulating layer 422 on the tip of the first electrode 402. Note that while the first electrodes 130 illustrated in FIGS. 1 and 3 rest within generally the same plane as the second electrode outlet surface 146, the tip of the first electrode 402 in FIG. 4 is slightly recessed so that the insulating layer 422 does not protrude from the outlet surface 412, thereby allowing the outlet surface 412 (and the plasma source 400) to more closely approach the surface of a workpiece. However, the tip of the first electrode 402 may be made to protrude from the outlet surface 412 if desired, just as it may be made recessed from the outlet surface 412 if desired.

It is noted that since all process gases have some dielectric properties, the plasma generator 100 may be able to operate under some conditions with the insulating layers 138 and 148 eliminated entirely. However, since plasma generation would be hindered under most standard operating conditions by nonuniform discharge within the gas passages 142 if the insulating layers 138 and/or 148 are eliminated, inclusion of at least some insulation is preferred.

EXPERIMENTAL RESULTS

The following experimental results were obtained with a plasma generator having a structure generally similar to the plasma generator 100 of FIGS. 1 and 3. The first electrodes were arrayed in rows with their longitudinal axes spaced approximately ¼ inch (0.635 cm) apart within rows, with approximately ⅜ inch (0.95 cm) between rows; the second electrode member had a thickness/gas passage length of approximately 1 inch (2.5 cm); and the plasma sources were arrayed across an approximately 4 inch (10.2 cm) by 6.25 inch (15.9 cm) second electrode outlet surface. Heating/cooling passages were situated in the plasma generator frame rather than in the second electrode member.

Experiment 1
Surface Oxidation of Polyethylene (PE) Film Substrates
Experimental Conditions:

RF power: 500 W

Frequency: 10 kHz

Voltage: maximum 10 kV

Treatment time: 2 minutes

Process gas: air

FIG. 5 depicts ESCA (Electron Spectroscopy for Chemical Analysis) data for the treated surface. The ESCA data indicate a 19% relative oxygen atomic concentration in comparison to the 8% oxygen content of a virgin PE substrate, and the presence of C—O (286.5 eV), C=O (288 eV), and OC=O (289.2 eV) functionalities in the surface layers of the plasma-exposed PE. This level of oxidation is significant in view of the treatment time and other parameters used, and indicates that the plasma generator is capable of highly efficient treatment.

Experiment 2
Surface Fluorination of Polyethylene (PE) Film Substrates
Experimental Conditions:
  RF power: 500 W
  Frequency: 10 kHz
  Voltage: maximum 10 kV
  Treatment time: 2 minutes
  Process gas: $CF_4$ With reference to FIG. 6, ESCA data for the treated PE indicate the presence of CF (287.9 eV) and $CF_2$ (288.2 eV) groups in addition to the carbon- and oxygen-based functionalities. A 23.5% surface fluorine atomic concentration is present in the surface layers. The existence of different carbon- and fluorine-based functionalities in the surface layers of the plasma-treated PE is also emphasized by the bimodal nature of the Fls ESCA diagram. The level of fluorination is regarded as being extremely high in comparison to prior plasma generators in view of the experimental parameters used.

Experiment 3
Disinfection of Artificially Contaminated Stainless Steel (SS) Chips
Experimental Conditions:
  RF power: 500 W
  Frequency: 10 kHz
  Voltage: maximum 10 kV
  Treatment time: 2 minutes
  Process gas: $CF_4$ Artificially contaminated 1×1 inch SS chips were exposed to air- and oxygen-plasma environments. Chips having an original bacterium concentration of 5.44 log cfu/chip were treated for 2 and 5 minutes using air as the process gas, and the same chips were also treated for 2 minutes using oxygen as the process gas. Bacteria concentration at the end of treatment were:

(1) 2 minutes, air: 22.81 log cfu (reduction of 99.766%)
  (2) 5 minutes, air: Not detectable (99.996%)
  (3) 2 minutes, oxygen: Not detectable (99.996%)

These results demonstrate exceptional disinfection performance with low treatment time.

It is understood that the various preferred versions of the plasma generator are shown and described above to illustrate different possible features of the invention and the varying ways in which these features may be combined. Apart from combining the foregoing features of the plasma generators in varying ways, other modifications are also considered to be within the scope of the invention. Following is an exemplary list of such modifications.

First, it is emphasized that plasma generators in accordance with the invention may be made with a large range of sizes and configurations beyond the ones illustrated. Since the design characteristics of the plasma generator allow very densely spaced plasma sources, treatment of adjacent workpieces without the need to pass them through the free space wherein plasma is generated, and easier capture of exhaust gases, plasma generators may even be constructed in a lightweight and compact handheld unit. For example, an array of plasma sources such as the one shown in FIG. 1 may be provided on the underside of a handheld unit which may be operated in much the same manner as a common clothes iron, e.g., for the purpose of disinfecting items over which the plasma generator is run.

Second, while the first electrodes have been depicted with a rodlike form and the second electrodes have been depicted with a cylindrical form capable of receiving the first electrodes in complementary spaced relation, it may be possible to use electrodes using other shapes instead. In general, electrodes having circular (or at least curvilinear) cross-sections are preferred, such as rodlike or conical electrodes, since corners defined on an electrode—e.g., those on an elongated bar-like first electrode having a rectangular cross-section—can lead to irregular plasma generation. Additionally, electrodes having symmetry about their central axes are preferred over electrodes which lack such symmetry, e.g., over an elongated first electrode with an oval cross-section, since axial symmetry makes it easier to center the first electrodes within the second electrodes. Nevertheless, it may in some cases be useful to modify electrode shapes, and use other than circular/cylindrical electrodes, to attain desired effects.

Third, it should be understood that while the electrodes have been depicted as being formed in monolithic structures wherein the first electrodes are integrally affixed to a common bed, and the second electrodes are formed in an integrally-formed second electrode member, it is possible to form either or both of the electrodes as individual units which are then connected together, or in multiple sets of electrodes which are then connected together, to attain desired effects. As an example, consider that a user may sometimes wish to vary the characteristics of the plasma generator power supply to attain some desired current/voltage, and thereby modify plasma generation to attain some desired purpose. Since commercially available power supplies which provide a greater range of variability in current/voltage output tend to have greater cost, it may be useful to provide multiple plasma generators as in FIG. 1, but wherein each has a lesser number of plasma sources, and wire them in series and/or parallel and situate them in an array so that the separate electrode sets effectively combine to provide a single plasma generator. Since the series and/or parallel arrangement of the subcomponent electrode sets will affect the current/voltage that each receives from the power supply, a user can effectively step down the current/voltage in some or all of the subcomponent generators to attain desired current/voltage supply to each, thereby effectively providing the power supply with a greater range of supply variability. Thus, a user may be able to attain significantly greater current/voltage supply variability from a power supply by using arrayed electrode sets wherein selected ones of the subcomponent electrode sets may be switched to be in series or parallel as desired, thereby attaining a desired power supply to each (in conjunction with any variability already provided by the power supply).

Fourth, the plasma sources need not be spaced in an array across a plane, and may instead be spaced across a curved or segmented surface if such a configuration would better treat the workpieces in question. As an example, if a workpiece has a cylindrical shape, a plasma generator may be formed with a curved first electrode bed and curved second electrode member so that the plasma sources are arrayed across a curved second electrode outlet surface which conforms to at least a portion of the surface of the workpiece. Alternatively, a plasma generator might include sets of planar first electrode beds and second electrode members, but these sets may be adjacently situated so that they provide a segmented second electrode outlet surface bearing plasma source arrays which generally conform to at least a portion of the cylindrical surface.

The invention is not intended to be limited to the preferred embodiments described above, but rather is intended to be limited only by the claims set out below. Thus, the invention encompasses all alternate embodiments that fall literally or equivalently within the scope of these claims.

What is claimed is:

1. A plasma generator comprising:
   a. several first electrodes extending from a common bed;
   b. a second electrode member having several gas passages defined therein which open onto an outlet surface defined on the second electrode member,
   wherein:
   (1) the first electrodes are situated within the gas passages, and
   (2) the second electrode member is at a different potential than the first electrodes.

2. The plasma generator of claim 1 further comprising an insulating layer interposed between the second electrode member and the first electrodes.

3. The plasma generator of claim 2 wherein the insulating layer is also provided between the second electrode member and the common bed of the first electrodes.

4. The plasma generator of claim 1 wherein each of the first electrodes extends from a base at the common bed to a tip spaced away from the common bed, and wherein at least the tip is covered by insulating material.

5. The plasma generator of claim 1 wherein the second electrode member is spaced from the first electrodes and their common bed.

6. The plasma generator of claim 1 further comprising:
   a. a gas supply communicating with the gas passages of the second electrode member, and
   b. a porous barrier interposed between the gas supply and the gas passages.

7. The plasma generator of claim 1 wherein the gas passages open onto a plenum space defined between the second electrode member and the common bed of the first electrodes.

8. The plasma generator of claim 7 wherein the plenum space has a porous barrier therein, the porous barrier being situated between the second electrode member and the common bed of the first electrodes.

9. The plasma generator of claim 8 further comprising a gas supply opening onto the plenum space, and wherein the opening is on the side of the porous barrier opposite the second electrode member.

10. The plasma generator of claim 1 wherein the second electrode member has an enclosed heating/cooling passage defined therein.

11. The plasma generator of claim 1 wherein the outlet surface of the second electrode member is surrounded by a ledge, whereby situating the ledge adjacent a workpiece defines a chamber between the outlet surface and the workpiece, the chamber being bounded by the outlet surface, the ledge, and the workpiece.

12. The plasma generator of claim 1 further comprising positioning means for adjusting the location of a workpiece with respect to the outlet surface of the second electrode.

13. A plasma generator comprising:
   a. several first electrodes at a first potential extending from a common bed;
   b. several second electrodes, each at a second potential different from the first potential, each second electrode having:
      i. a gas passage defined therein which opens onto an outlet surface on the second electrode, and
      ii. one of the first electrodes situated within its gas passage, this first electrode being spaced from the second electrode;

wherein the outlet surfaces of the second electrodes are adjacently arrayed along a common surface, whereby plasma generated in gas between the first and second electrodes may be ejected from the gas passages onto an article adjacent the common surface.

14. The plasma generator of claim 13 wherein the second electrodes are integrally formed within a common second electrode member, whereupon the common surface is defined.

15. The plasma generator of claim 14 further comprising a insulating layer interposed between the first and second electrodes.

16. The plasma generator of claim 15 wherein the insulating layer is also provided between the common second electrode member of the second electrodes and the common bed of the first electrodes.

17. The plasma generator of claim 14 wherein the gas passages of the second electrodes extend between the common second electrode member of the second electrodes and the common bed of the first electrodes.

18. The plasma generator of claim 13 wherein the common surface is bounded by a ledge, whereby situating the ledge adjacent a workpiece defines a chamber between the common surface, the ledge, and the workpiece.

19. The plasma generator of claim 13 farther comprising:
   a. a gas supply communicating with the gas passages of the second electrodes, and
   b. a porous barrier interposed between the gas supply and the gas passages.

20. The plasma generator of claim 13 further comprising positioning means for adjusting the location of a workpiece relative to the common surface whereupon the outlet surfaces of the second electrodes are arrayed.

21. A plasma generator comprising:
   a. several elongated first electrodes, each extending from a base to a tip;
   b. a second electrode member at a different potential than the first electrodes, each having several second electrodes defined therein, each second electrode being defined by a gas passage extending from an outlet surface on the second electrode member to an inlet surface on the second electrode member,
   wherein each first electrode is situated within the gas passage of one of the second electrodes.

22. The plasma generator of claim 21 wherein an insulating layer is interposed between each first electrode and the second electrode member.

23. The plasma generator of claim 21 wherein the first electrodes have their bases extend from a common bed, the common bed being situated adjacent the inlet surface of the second electrode member.

24. The plasma generator of claim 23 further comprising a insulating layer between the first and second electrodes, and also between the inlet surface of the second electrode member and the common bed of the first electrodes.

25. The plasma generator of claim 21 wherein the outlet surface of the second electrode member is bounded by a ledge, whereby situating the ledge adjacent a workpiece defines a chamber bounded by the outlet surface, the ledge, and the workpiece.

26. The plasma generator of claim 21 further comprising positioning means for adjusting the location of a workpiece relative to the outlet surface of the second electrode member.

27. A plasma generator comprising:
   a. several first electrodes extending from a common bed;
   b. a second electrode having several gas passages defined therein which open onto an outlet surface defined on the second electrode; and
   c. an insulating layer interposed between the second electrode and the first electrodes,
   wherein the first electrodes are situated within the gas passages.

28. The plasma generator of claim 27 wherein the insulating layer is also provided between the second electrode and the common bed of the first electrodes.

29. The plasma generator of claim 27 wherein each of the first electrodes extends from a base at the common bed to a tip spaced away from the common bed, and wherein at least the tip is covered by insulating material.

30. The plasma generator of claim 27 wherein the second electrode is spaced from the first electrodes and their common bed.

31. The plasma generator of claim 27 further comprising:
   a. a gas supply communicating with the gas passages of the second electrode, and
   b. a porous barrier interposed between the gas supply and the gas passages.

32. The plasma generator of claim 27 wherein the gas passages open onto a plenum space defined between the second electrode and the common bed of the first electrodes.

33. The plasma generator of claim 32 wherein the plenum space has a porous barrier therein, the porous barrier being situated between the second electrode and the common bed of the first electrodes.

34. The plasma generator of claim 33 further comprising a gas supply opening onto the plenum space, and wherein the opening is on the side of the porous barrier opposite the second electrode.

35. The plasma generator of claim 27 wherein the second electrode has an enclosed heating/cooling passage defined therein.

36. The plasma generator of claim 27 wherein the outlet surface of the second electrode is surrounded by a ledge, whereby situating the ledge adjacent a workpiece defines a chamber between the outlet surface and the workpiece, the chamber being bounded by the outlet surface, the ledge, and the workpiece.

37. The plasma generator of claim 27 further comprising positioning means for adjusting the location of a workpiece with respect to the outlet surface of the second electrode.

38. The plasma generator of claim 27 wherein the second electrode is at a different potential than the first electrodes.

39. A plasma generator comprising:
   a. several first electrodes extending from a common bed, wherein
      (1) each of the first electrode extends from a base at the common bed to a tip spaced away from the common bed, and
      (2) at least the tip is covered by insulating material;
   b. a second electrode having several gas passages defined therein which open onto an outlet surface defined on the second electrode,
   wherein the first electrodes are situated within the gas passages.

40. The plasma generator of claim 39 wherein the second electrode is at a different potential than the first electrodes.

41. The plasma generator of claim 39 further comprising an insulating layer interposed between the second electrode and the first electrodes.

42. The plasma generator of claim 41 wherein the insulating layer is also provided between the second electrode and the common bed of the first electrodes.

43. The plasma generator of claim 39 wherein the second electrode is spaced from the first electrodes and their common bed.

44. The plasma generator of claim 39 further comprising:
   a. a gas supply communicating with the gas passages of the second electrode, and
   b. a porous barrier interposed between the gas supply and the gas passages.

45. The plasma generator of claim 39 wherein the gas passages open onto a plenum space defined between the second electrode and the common bed of the first electrodes.

46. The plasma generator of claim 45 wherein the plenum space has a porous barrier therein, the porous barrier being situated between the second electrode and the common bed of the first electrodes.

47. The plasma generator of claim 46 further comprising a gas supply opening onto the plenum space, and wherein the opening is on the side of the porous barrier opposite the second electrode.

48. The plasma generator of claim 39 wherein the second electrode has an enclosed heating/cooling passage defined therein.

49. The plasma generator of claim 39 wherein the outlet surface of the second electrode is surrounded by a ledge, whereby situating the ledge adjacent a workpiece defines a chamber between the outlet surface and the workpiece, the chamber being bounded by the outlet surface, the ledge, and the workpiece.

50. The plasma generator of claim 39 further comprising positioning means for adjusting the location of a workpiece with respect to the outlet surface of the second electrode.

* * * * *